United States Patent
Jacob et al.

(10) Patent No.: US 9,673,222 B2
(45) Date of Patent: Jun. 6, 2017

(54) FIN ISOLATION STRUCTURES FACILITATING DIFFERENT FIN ISOLATION SCHEMES

(71) Applicants: GLOBALFOUNDRIES Inc., Grand Cayman (KY); STMicroelectronics, Inc., Coppell, TX (US); International Business Machines Corporation, Armonk, NY (US)

(72) Inventors: Ajey Poovannummoottil Jacob, Watervliet, NY (US); Kangguo Cheng, Schenectady, NY (US); Bruce Doris, Slingerlands, NY (US); Nicolas Loubet, Guilderland, NY (US); Prasanna Khare, Schenectady, NY (US); Rama Divakaruni, Ossining, NY (US)

(73) Assignees: GLOBALFOUNDRIES Inc., Grand Cayman (KY); STMicroelectronics, Inc., Coppel;l, TX (US); International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/156,506

(22) Filed: May 17, 2016

(65) Prior Publication Data
US 2016/0260742 A1 Sep. 8, 2016

Related U.S. Application Data

(62) Division of application No. 13/945,415, filed on Jul. 18, 2013, now Pat. No. 9,349,730.

(51) Int. Cl.
H01L 27/12 (2006.01)
H01L 21/02 (2006.01)
(Continued)

(52) U.S. Cl.
CPC ...... *H01L 27/1211* (2013.01); *H01L 21/0262* (2013.01); *H01L 21/02236* (2013.01);
(Continued)

(58) Field of Classification Search
CPC ............. H01L 27/0886; H01L 27/0924; H01L 27/1211; H01L 29/66795; H01L 29/785
(Continued)

(56) References Cited

U.S. PATENT DOCUMENTS 5,926,722 A  7/1999  Jang et al.
5,963,811 A  10/1999  Chern
(Continued)

OTHER PUBLICATIONS

Akarvardar et al., Office Action for U.S. Appl. No. 13/945,627, filed Jul. 18, 2013 (U.S. Patent Publication No. 2015-0021663 A1), dated Jul. 11, 2014 (7 pages).
(Continued)

*Primary Examiner* — Matthew E Warren
(74) *Attorney, Agent, or Firm* — Heslin Rothenberg Farley & Mesiti P.C.; Kristian E. Ziegler

(57) ABSTRACT

Methods and semiconductor structures formed from the methods are provided which facilitate fabricating semiconductor fin structures. The methods include, for example: providing a wafer with at least one semiconductor fin extending above a substrate; transforming a portion of the semiconductor fin(s) into an isolation layer, the isolation layer separating a semiconductor layer of the semiconductor fin(s) from the substrate; and proceeding with forming a fin device(s) of a first architectural type in a first fin region of the semiconductor fin(s), and a fin device(s) of a second architectural type in a second fin region of the semiconductor fin(s), where the first architectural type and the second architectural type are different fin device architectures.

19 Claims, 12 Drawing Sheets

(51) Int. Cl.

| | | |
|---|---|---|
| *H01L 27/088* | (2006.01) | |
| *H01L 29/78* | (2006.01) | |
| *H01L 27/092* | (2006.01) | |
| *H01L 29/66* | (2006.01) | |
| *H01L 21/84* | (2006.01) | |
| *H01L 21/306* | (2006.01) | |
| *H01L 21/308* | (2006.01) | |

(52) U.S. Cl.
CPC .. *H01L 21/02529* (2013.01); *H01L 21/02532* (2013.01); *H01L 21/02612* (2013.01); *H01L 21/02614* (2013.01); *H01L 21/308* (2013.01); *H01L 21/30604* (2013.01); *H01L 21/845* (2013.01); *H01L 27/0886* (2013.01); *H01L 27/0924* (2013.01); *H01L 29/66795* (2013.01); *H01L 29/785* (2013.01); *H01L 29/7848* (2013.01); *H01L 29/7849* (2013.01); *H01L 21/02255* (2013.01)

(58) Field of Classification Search
USPC ........................................ 257/347, 401, 619
See application file for complete search history.

(56) References Cited

U.S. PATENT DOCUMENTS

| | | | |
|---|---|---|---|
| 6,635,543 B2 | 10/2003 | Furukawa et al. | |
| 7,214,991 B2* | 5/2007 | Yeo ................ | H01L 21/823828 257/331 |
| 7,871,873 B2 | 1/2011 | Maszara et al. | |
| 7,888,273 B1 | 2/2011 | Wang et al. | |
| 8,048,723 B2 | 11/2011 | Chang et al. | |
| 8,866,204 B2 | 10/2014 | Liu et al. | |
| 2004/0063286 A1 | 4/2004 | Kim et al. | |
| 2006/0071213 A1 | 4/2006 | Ma et al. | |
| 2007/0000897 A1 | 1/2007 | Ingle et al. | |
| 2007/0090443 A1 | 4/2007 | Choi et al. | |
| 2007/0102834 A1 | 5/2007 | Enicks et al. | |
| 2007/0249174 A1 | 10/2007 | Yang | |
| 2007/0272954 A1 | 11/2007 | Chen et al. | |
| 2008/0128796 A1* | 6/2008 | Zhu ....................... | H01L 21/845 257/328 |
| 2010/0163971 A1* | 7/2010 | Hung ................ | H01L 29/66795 257/327 |
| 2012/0168913 A1 | 7/2012 | Toh et al. | |
| 2013/0026539 A1 | 1/2013 | Tang et al. | |
| 2013/0181263 A1 | 7/2013 | Cai et al. | |
| 2013/0244387 A1 | 9/2013 | Cho | |
| 2013/0285153 A1* | 10/2013 | Lee ................... | H01L 21/02532 257/369 |
| 2013/0330889 A1 | 12/2013 | Yin et al. | |
| 2014/0061734 A1 | 3/2014 | Basker et al. | |
| 2014/0061801 A1* | 3/2014 | Doornbos ....... | H01L 21/823807 257/351 |
| 2014/0103451 A1 | 4/2014 | Ouyang et al. | |
| 2014/0124842 A1 | 5/2014 | Wang et al. | |
| 2014/0124863 A1* | 5/2014 | Cheng .................. | H01L 21/845 257/350 |
| 2014/0159123 A1 | 6/2014 | Cheng et al. | |
| 2014/0191296 A1 | 7/2014 | Bergendahl et al. | |
| 2014/0252497 A1 | 9/2014 | Peng et al. | |
| 2015/0001591 A1 | 1/2015 | Akarvardar et al. | |
| 2015/0021663 A1 | 1/2015 | Akarvardar et al. | |
| 2015/0021691 A1 | 1/2015 | Akarvardar et al. | |
| 2015/0021709 A1 | 1/2015 | Jacob et al. | |
| 2015/0024572 A1 | 1/2015 | Jacob et al. | |

OTHER PUBLICATIONS

Akarvardar et al., Office Action for U.S. Appl. No. 13/927,698, filed Jun. 26, 2013 (U.S. Patent Application Publication No. 2015/0001591 A1), dated Sep. 2, 2014.
Jacob et al., Office Action for U.S. Appl. No. 13/945,379, filed Jul. 18, 2013 (U.S. Patent Application Publication No. 2015/0021709 A1), dated Sep. 8, 2014.
Akarvardar et al., Office Action for U.S. Appl. No. 13/927,698, filed Jun. 26, 2013 (U.S. Patent Application Publication No. 2015/0001591 A1), dated Oct. 20, 2014.
Jacob et al., Office Action for U.S. Appl. No. 13/945,445, filed Jul. 18, 2013 (U.S. Patent Application Publication No. 2015/0024572A1), dated Nov. 17, 2014.
Akarvardar et al., Office Action for U.S. Appl. No. 13/945,455, filed Jul. 18, 2013 (U.S. Patent Publication No. 2015/0021691 A1), dated Jan. 21, 2015.
Akarvardar et al., Office Action for U.S. Appl. No. 13/945,627, filed Jul. 18, 2013 (U.S. Patent Publication No. 2015/0021663 A1), dated Jan. 21, 2015.
Akarvardar et al., Office Action for U.S. Appl. No. 13/927,698, filed Jun. 26, 2013 (U.S. Patent Application Publication No. 2015/0001591 A1), dated Feb. 24, 2015.
Akarvardar et al., Office Action for U.S. Appl. No. 13/945,627, filed Jul. 18, 2013 (U.S. Patent Application Publication No. 2015/0021663 A1), dated Mar. 20, 2015.
Akarvardar et al., Office Action for U.S. Appl. No. 13/945,455, filed Jul. 18, 2013 (U.S. Patent Application Publication No. 2015/0021691 A1), dated Apr. 30, 2015.
Jacob et al., Office Action for U.S. Appl. No. 13/945,379, filed Jul. 18, 2013 (U.S. Patent Application Publication No. 2015/0021709 A1), dated May 6, 2015.
Akarvardar et al., Final Office Action for U.S. Appl. No. 13/945,627, filed Jul. 18, 2013 (U.S. Patent Application Publication No. 2015/0021663 A1), dated Jul. 14, 2015.
Akarvardar et al., Final Office Action for U.S. Appl. No. 13/927,698, filed Jun. 26, 2013 (U.S. Patent Application Publication No. 2015/0001591 A1), dated Jul. 27, 2015.
Akarvardar et al., Office Action for U.S. Appl. No. 13/945,455, filed Jul. 18, 2013 (U.S. Patent Application Publication No. 2015/0021691A1), dated Sep. 15, 2015.
Jacob et al., Final Office Action for U.S. Appl. No. 13/945,379, filed Jul. 18, 2013 (U.S. Patent Application Publication No. 2015/0021709 A1), dated Oct. 2, 2015.
Akarvardar et al., Office Action for U.S. Appl. No. 13/927,698, filed Jun. 26, 2013 (U.S. Patent Application Publication No. 2015/0001591 A1), dated Oct. 21, 2015.
Akarvardar et al., Office Action for U.S. Appl. No. 13/945,455, filed Jul. 18, 2013 (U.S. Patent Application Publication No. 2015/0021691A1), dated Dec. 7, 2015.
Akarvardar et al., "Bulk FINFET with Partial Dielectric Isolation Feature a Punch-Through Stopping Layer Under the Oxide", U.S. Appl. No. 13/927,698, filed Jun. 26, 2013.
Xu, Nuo, "Effectiveness of Strain Solutions for Next-Generation MOSFETs", University of California, Berkeley, Spring 2012, pp. 1-35.
Akarvardar et al., Office Action/Restriction Requirement for U.S. Appl. No. 13/945,455, filed Jul. 18, 2013 (U.S. Patent Application Publication No. 2015/0021691 A1), dated Nov. 14, 2014.

* cited by examiner

FIN ISOLATION STRUCTURES FACILITATING DIFFERENT FIN ISOLATION SCHEMES

CROSS REFERENCE TO RELATED APPLICATIONS

This application is a divisional application of U.S. patent application Ser. No. 13/945,415, filed Jul. 18, 2013, and entitled "FIN TRANSFORMATION PROCESS AND ISOLATION STRUCTURES FACILITATING DIFFERENT FIN ISOLATION SCHEMES," the entirety of which is hereby incorporated herein by reference.

FIELD OF THE INVENTION

The present invention relates to structures and methods of facilitating fabricating semiconductor structures such as fin devices, and more particularly to structures having an isolation layer and methods for providing an isolation layer within a semiconductor fin to facilitate integrating multiple fin device architectures into the fin with different isolation schemes.

BACKGROUND OF THE INVENTION

Fin field-effect transistor (FinFET) devices are currently being developed to replace conventional planar metal oxide semiconductor field-effect transistors (MOSFETs) in advanced complementary metal oxide semiconductor (CMOS) technology due to their improved short-channel effect immunity and higher on-current to off-current ratio ($I_{on}/I_{off}$). As is known, the term "fin" refers to a vertical structure within or upon which are formed, for instance, one or more FinFETs or other fin devices, such as passive devices, including capacitors, diodes, etc.

Further enhancements in fin device structures and fabrication methods therefor continue to be pursued for enhanced performance and commercial advantage.

BRIEF SUMMARY

The shortcomings of the prior art are overcome, and additional advantages are provided through the provision, in one aspect, of a method for facilitating fabricating semiconductor fin structures. The facilitating fabricating includes: providing a wafer with at least one semiconductor fin extending above a substrate; transforming a portion of the at least one semiconductor fin into an isolation layer, the isolation layer separating a semiconductor layer of the at least one semiconductor fin from the substrate; and proceeding with forming at least one fin device of a first architectural type in a first fin region of the at least one semiconductor fin and at least one fin device of a second architectural type in a second fin region of the at least one semiconductor fin, wherein the first architectural type and the second architectural type are different fin device architectures.

In a further aspect, a semiconductor structure is provided which includes: a wafer with at least one semiconductor fin extending above a substrate; a semiconductor layer and an isolation layer disposed within the at least one semiconductor fin, the isolation layer isolating the semiconductor layer of the at least one semiconductor fin from the substrate, wherein the semiconductor layer has a centrally disposed, V-shaped protrusion extending into the isolation layer; and at least one fin device of a first architectural type in a first fin region of the at least one semiconductor fin and at least one fin device of a second architectural type in a second fin region of the at least one semiconductor fin, wherein the first architectural type and the second architectural type are different fin device architectures.

Additional features and advantages are realized through the techniques of the present invention. Other embodiments and aspects of the invention are described in detail herein and are considered a part of the claimed invention.

BRIEF DESCRIPTION OF THE SEVERAL VIEWS OF THE DRAWINGS

One or more aspects of the present invention are particularly pointed out and distinctly claimed as examples in the claims at the conclusion of the specification. The foregoing and other objects, features, and advantages of the invention are apparent from the following detailed description taken in conjunction with the accompanying drawings in which:

DETAILED DESCRIPTION

Figure 1A:
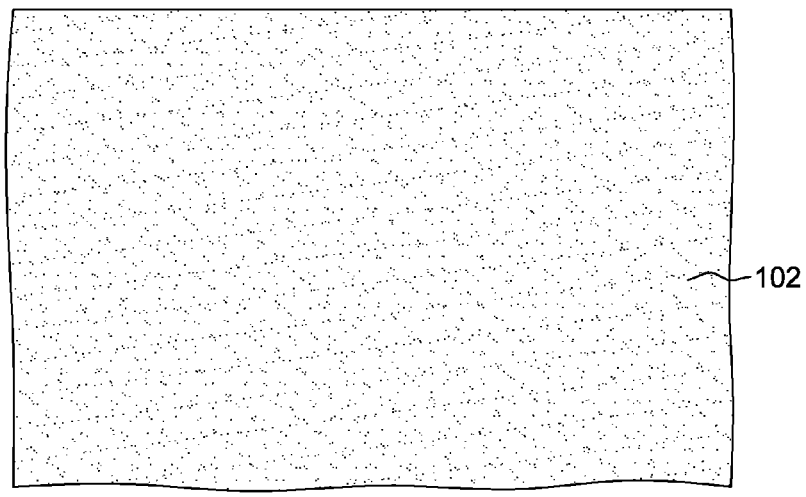
FIG. 1A is a cross-sectional elevational view of one embodiment of an intermediate structure obtained during a semiconductor fin fabrication process, in accordance with one or more aspects of the present invention.

Aspects of the present invention and certain features, advantages, and details thereof, are explained more fully below with reference to the non-limiting examples illustrated in the accompanying drawings. Descriptions of well-known materials, fabrication tools, processing techniques, etc, are omitted so as not to unnecessarily obscure the invention in detail. It should be understood, however, that the detailed description and the specific examples, while indicating aspects of the invention, are given by way of illustration only, and are not by way of limitation. Various substitutions, modifications, additions, and/or arrangements, within the spirit and/or scope of the underlying inventive concepts will be apparent to those skilled in the art from this disclosure.

The present disclosure provides, in part, fabrication methods for integrating multiple different fin device architectures with different isolation schemes into one or more fins. Different fin device architectures and/or fin isolation approaches may be desired for different applications. Processing methods for achieving different isolation schemes may require intermediate structures with an active semiconductor layer of a fin electrically isolated from the substrate prior to subsequent processing. Challenges arise when using conventional fin fabrication processing to provide an isolation layer between such an active semiconductor layer of a fin and the substrate, for instance, to facilitate integrating multiple fin device architectures with different isolation schemes without significant additional cost. By way of example, the different fin device architectures may include one or more low-leakage fin devices disposed above a fin isolation layer, integrated with one or more higher on-current fin devices with embedded stress elements such as embedded sources and drains extending through the fin isolation layer into the substrate.

Generally stated, provided herein, in one aspect, is a method for facilitating fabricating semiconductor fin structures. The facilitating fabricating includes, for instance: providing a wafer with at least one semiconductor fin extending above a substrate; transforming a portion of the at least one semiconductor fin into an isolation layer, the isolation layer separating a semiconductor layer of the at least one semiconductor fin from the substrate; and proceeding with forming at least one fin device of a first architectural type in a first region of the at least one semiconductor fin, and at least one fin device of a second architectural type in a second region of the at least one semiconductor fin, wherein the first architectural type and the second architectural type include different fin device architectures. In an enhanced embodiment, the method may further include, prior to the transforming, extending a height of the semiconductor fin(s) by: providing a conformal protective layer over the semiconductor layer of the semiconductor fin(s); and etching the substrate adjacent to the semiconductor fin(s) to extend the height of the semiconductor fin(s) above the substrate, and to define, below the semiconductor layer, at least in part, the portion of the at least one semiconductor fin to be transformed. In one example, the etching may include anisotropically etching the substrate during which the conformal protective layer protects the semiconductor layer of the semiconductor fin(s).

In one embodiment, the portion of the semiconductor fin(s) to be transformed includes an exposed sidewall region below the conformal protective layer protecting the semiconductor layer of the at least one semiconductor fin, and the transforming includes transforming the portion of the at least one semiconductor fin into the isolation layer through the exposed sidewall region of the semiconductor fin(s). For instance, transforming the portion of the semiconductor fin may include oxidizing the portion of the at least one semiconductor fin to form the isolation layer. This oxidizing may include: providing an oxidizing material in contact with the portion of the at least one semiconductor fin; and annealing the oxidizing material and the at least one semiconductor fin to oxidize the portion of the at least one semiconductor fin and thereby form the isolation layer therein.

As an optional process, prior to the transforming, the portion of the at least one semiconductor fin to be transformed may be thinned via or through the exposed sidewall region thereof. For example, isotropically etching the exposed sidewall region of the portion of the at least one semiconductor fin may be performed.

In an alternate embodiment, prior to transforming the portion of the at least one semiconductor fin into the isolation layer, the method may include: providing a conformal protective layer over the semiconductor layer of the at least one semiconductor fin; and thinning the portion of the at least one semiconductor fin to facilitate the transforming of the portion of the at least one semiconductor fin into the isolation layer separating the semiconductor layer from the substrate. Again, the transforming of the portion of the at least one semiconductor fin may include oxidizing the portion of the at least one semiconductor fin by providing an oxidizing material in contact with the portion of the at least one semiconductor fin, and annealing the oxidizing material and the at least one semiconductor fin to oxidize the portion of the at least one semiconductor fin and form the isolation region.

In another embodiment, the method for facilitating fabricating semiconductor fin structures could further include modifying the at least one fin in a first fin region, while protecting the at least one fin in a second fin region thereof. In one implementation, protecting the second fin region could include providing a protective mask over the second fin region of the at least one fin before modifying the at least one fin in the first fin region thereof; and removing the protective mask over the second fin region subsequent to modifying the at least one fin in the first fin region thereof. By way of specific example, the at least one fin device of the first architectural type may include at least one fin transistor of the first architectural type and the at least one fin device of the second architectural type may include at least one fin transistor of the second architectural type. In such an example, the at least one fin transistor of the first architectural type in the first fin region could include at least one embedded stress element extending through the isolation layer into the substrate, and the at least one fin transistor of the second architectural type in the second fin region could include an isolated-type fin transistor disposed above the isolation layer. For example, modifying the first fin region of the at least one fin may include forming at least one fin recess in one fin of the at least one fin within the first fin region while protecting the one fin in the second fin region of the at least one fin, wherein the at least one fin recess extends through the isolation layer to the substrate beneath the one fin. In such a case, the substrate could include a semiconductor substrate, and the proceeding could include epitaxially growing a semiconductor material from, at least in part, the semiconductor substrate through the at least one fin recess in the one fin, the epitaxially growing further providing the semiconductor material, at least partially, over the one fin in the second fin region. Furthermore, the epitaxially-grown semiconductor material could include one of silicon germanium, silicon carbon, or silicon germanium carbon, depending, for instance, on the type of transistor being formed. In another example, the epitaxially-grown semiconductor material could include one of n-type or p-type material.

If desired, in a further embodiment, the method may further include providing a second or additional protective layer over the first fin region after processing thereof to form the fin devices of the first architectural type in order to facilitate processing within the second fin region to form fin devices of the second architectural type. Note that various architectural-type devices are described hereinbelow by way of example only. Note also, that in another embodiment, the first and second fin regions could be processed simultaneously, without the use of protective layers, that is, depending on the particular fabrication processes employed to create the fin devices in the first and second fin regions.

In another aspect, a semiconductor structure is provided which includes: a wafer with at least one semiconductor fin extending above a substrate; a semiconductor layer and an isolation layer disposed within the semiconductor fin(s), the isolation layer isolating the semiconductor layer of the semiconductor fin(s) from the substrate, wherein the semiconductor layer has a centrally disposed, V-shaped protrusion extending into the isolation layer; and at least one fin device of a first architectural type in a first fin region of the semiconductor fin(s) and at least one fin device of a second architectural type in a second fin region of the semiconductor fin(s), wherein the first architectural type and the second architectural type are different fin device architectures.

Reference is made below to the drawings, which are not drawn to scale for ease of understanding, wherein the same reference numbers used throughout different figures designate the same or similar components.

FIG. 1A illustrates a cross-sectional view of an intermediate structure 100 obtained during fabrication of semiconductor fin structures, in accordance with one or more aspects of the present invention. As shown, structure 100 includes a substrate 102, which may be (in one example) a bulk semiconductor material such as a bulk silicon wafer. As a more specific example, substrate 102 may include any silicon-containing substrate including, but not limited to, silicon (Si), single crystal silicon, polycrystalline Si, amorphous Si, silicon-on-nothing (SON), silicon-on-insulator (SOI), or silicon-on-replacement insulator (SRI) substrates and the like. Substrate 102 might be, for instance, approximately 600-700 micrometers thick, as one example only. Processing, as illustrated by way of example in FIGS. 1B through 1T, may be performed in or above substrate 102 to create, for example, semiconductor fin structures with different isolation approaches.

Figure 1B:
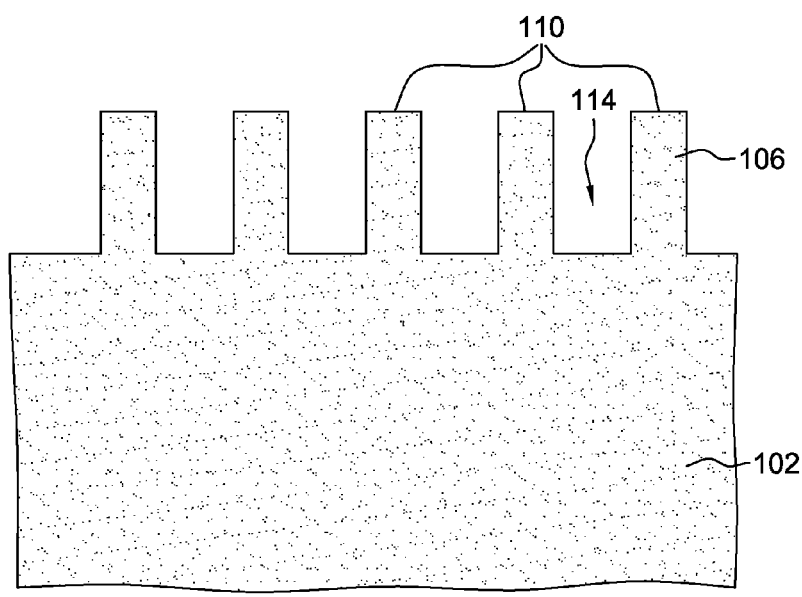
FIG. 1B depicts the structure of FIG. 1A after forming multiple semiconductor fins within the structure, in accordance with one or more aspects of the present invention.

FIG. 1B illustrates the structure of FIG. 1A after formation of multiple semiconductor fins 110 extending above the substrate, each including a semiconductor layer 106. By way of example, the semiconductor fins 110 may be formed by removing one or more portions of substrate 102 to create spaces 114, as illustrated. For example, formation of semiconductor fins 110 may be achieved by patterning the structure using various schemes, such as: direct lithography; sidewall image transfer technique; extreme ultraviolet lithography (EUV); e-beam technique; litho-etch litho-etch; or litho-etch litho-freeze. Following patterning, removal may be performed, for example, by any suitable etching process, such as an anisotropic dry etching process, for instance, reactive-ion-etching (RIE) in sulfur hexafluoride ($SF_6$). In one example, adjacent resulting semiconductor fins 110 are separated by a space 114. Although the following numbers are relative and the heights could vary, as one specific example, a semiconductor fin 110 may have a height of about 40 nanometers, and a length of about one micrometer, several micrometers, or the diameter of the entire wafer, while the thickness of the fin may be approximately 10 nanometers or less.

Figure 1C:
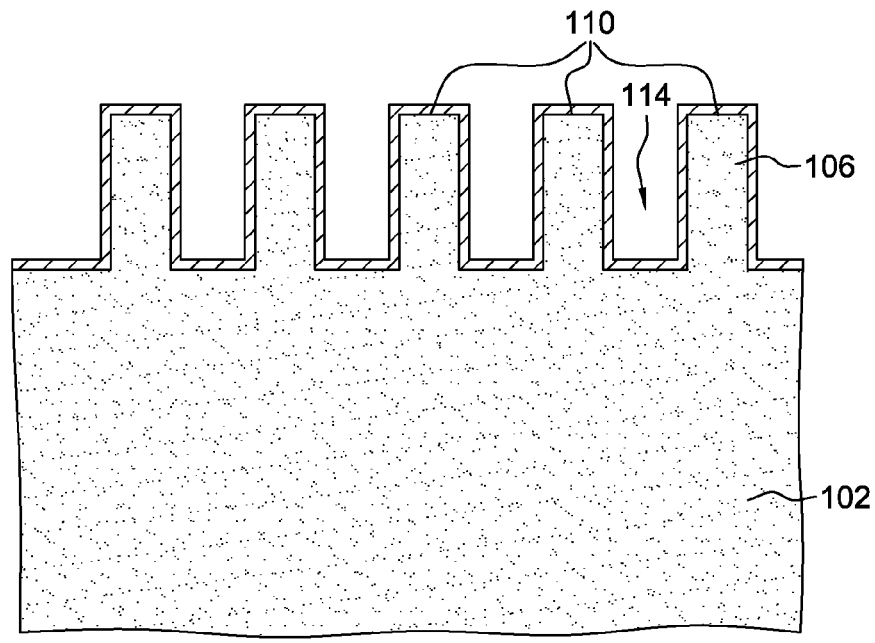
FIG. 1C depicts the structure of FIG. 1B after providing a conformal protective layer over the multiple semiconductor fins, in accordance with one or more aspects of the present invention.

FIG. 1C illustrates the structure of FIG. 1B after a conformal protective layer 108 has been provided over semiconductor layers 106 of semiconductor fins 110, in order to protect semiconductor layers 106 during further processing. In one embodiment, protective layer 108 is, for instance, a hard mask layer conformally deposited over the semiconductor fins, and may include a nitride, such as, for example, silicon nitride. The deposition process may include any conventional process such as, for example, low temperature chemical vapor deposition (CVD), plasma-enhanced CVD (PECVD), or atomic layer deposition (ALD). In one specific example, silicon nitride may be deposited using process gases such as, for example, dichlorosilane ($SiH_2Cl_2$) and ammonia ($NH_3$) and using known process conditions. In another example, where no high temperature processes are involved, optical dispersive layer (ODL) and flowable CVD (FCVD) masking may also be used. In a further example, a low-pressure CVD or ALD-created mask may be used to form the protective layer. In another example, other hard mask materials, such as metals, may be used. In other examples, the protective layer 108 may be a hard mask having an oxide, oxynitride, or metal oxide material, deposited using any conventional process. In such a case, while the protective layer 108 material may be suitable to protect semiconductor layer 106 during processing to extend the semiconductor fins 110 (as depicted in FIG. 1E), it would be desirable to additionally or alternatively use a non-oxide based protective layer during the subsequent oxidation processing (FIGS. 1G & 1F) to protect the semiconductor layers 106.

Figure 1D:
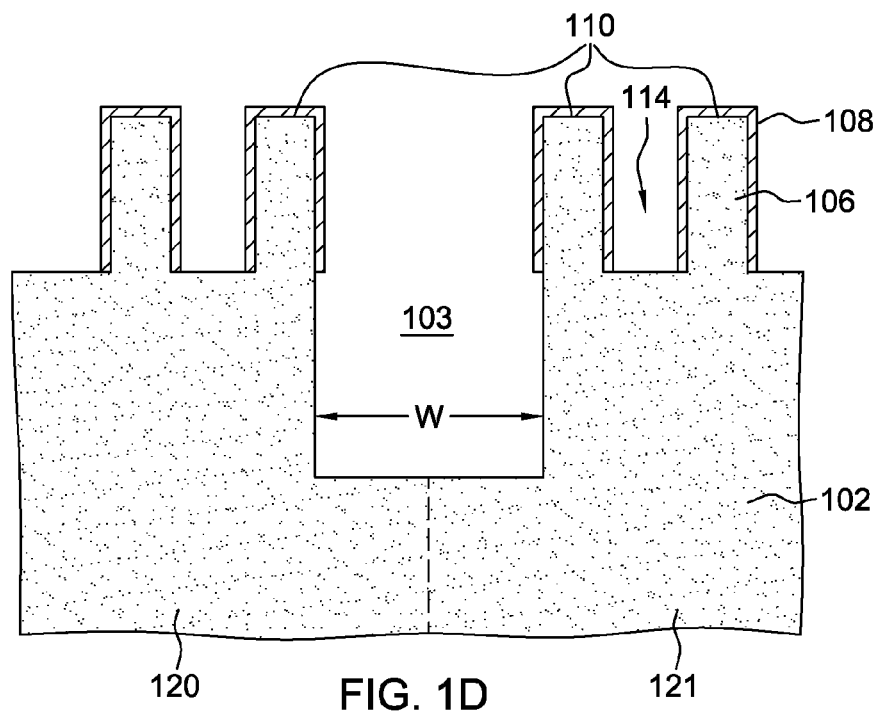
FIG. 1D depicts the structure of FIG. 1C after fin cut processing resulting in removal of one or more semiconductor fins, in accordance with one or more aspects of the present invention.

FIG. 1D illustrates the structure of FIG. 1C after, in one embodiment, fin cut processing has been employed in a region 103 of the structure to facilitate separation of the fins into, for instance, a first array 120 and a second array 121, with a width W shown at the fin cut between fins of first array 120 and fins of second array 121 that is larger than the width of space 114 between adjacent fins within the first or second arrays. In subsequent processing of the structure, this greater width W could facilitate, for instance, deep or shallow trench isolation processing to separate the different regions of the wafer, and thus facilitate creation of different fin devices, as described herein. In one example, the first and second fin arrays or groups could be part of the same chip, supporting (for instance) a system-on-chip design. In addition to fin cut processing, FIG. 1D illustrates the results of continued processing such that a portion of protective layer 108 has been removed so that only the top and sidewalls of semiconductor fins 110 are protected, while the base of substrate 102 has been exposed, in order to facilitate further processing. Both the fin cut process and removal of portions of the protective layer 108 may be achieved using any of the removal processes described above in relation to formation of semiconductor fins 110, such as by, for example, masking, patterning, and anisotropic dry etching. In other examples, fin cut processing may take place at different stages of a semiconductor fin structure fabrication process, such as during or after initial formation of the tins, or after gate structures have been disposed over the semiconductor fins.

Figure 1E:
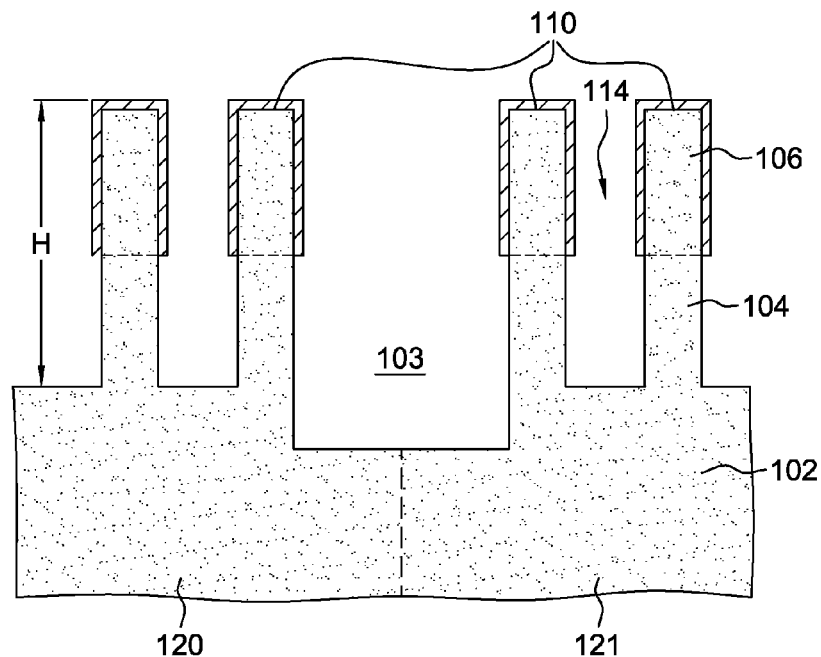
FIG. 1E depicts the structure of FIG. 1D after further etching of the substrate to extend the height of the semiconductor fins relative to a main surface of the substrate, in accordance with one or more aspects of the present invention.

FIG. 1E illustrates the structure of FIG. 1D after etching of substrate 102 adjacent to fins 110 to extend the height 'H' of the semiconductor fins 110. In one process embodiment, protective layer 108 protects semiconductor layer 106 of semiconductor fin 110 while etching of substrate 102 is performed to extend the height of semiconductor fins 110 and define the portions 104 of semiconductor fins 110 to be transformed as discussed herein. Removal of substrate 102 material may be performed using any of various processes, such as anisotropic dry etching. By way of example, anisotropic etching with an etchant selective to the substrate material may be used to directionally remove substrate material and create, as depicted, uniformly extended semiconductor fins 110 having a semiconductor layer 106 protected by protective layer 108, and a portion 104 that remains unprotected. In one specific example, semiconductor fins 110 may be extended by an additional 40 to 100 nanometers, yielding a total height of between 80 to 200 nanometers.

In another embodiment, subsequent to the anisotropic etching, isotropic etching with an etchant selective to the substrate material may optionally be used to thin portion 104 of semiconductor fins 110. In such a case, the portion 104 may be etched until its width decreases to, for instance, about 3 to 5 nanometers, and more generally, to a minimum width sufficient to maintain structural stability during the remaining desired processing steps, such as those described below, without the semiconductor fin structure(s) collapsing.

Figure 1F:
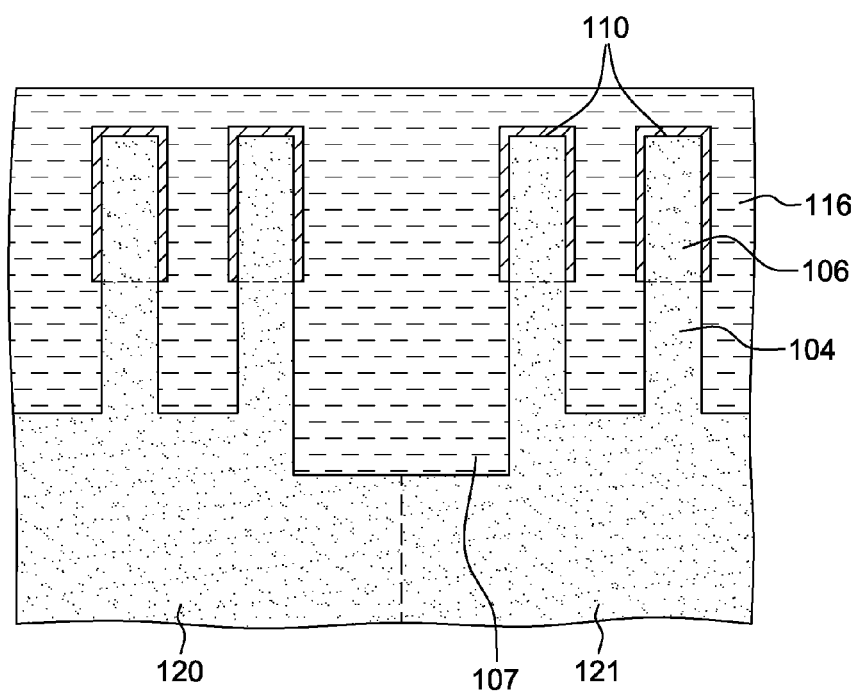
FIG. 1F depicts the structure of FIG. 1E after providing an oxidizing material over the structure, in accordance with one or more aspects of the present invention.
Figure 1G:
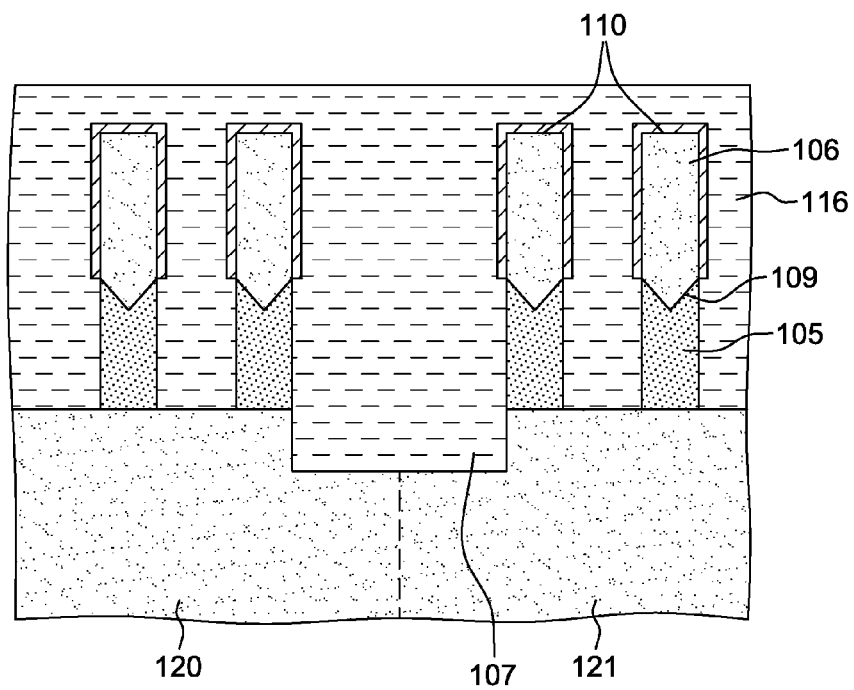
FIG. 1G depicts the structure of FIG. 1F after annealing the oxidizing material and the semiconductor fins to create isolation layers in the fins, in accordance with one or more aspects of the present invention.

FIGS. 1F & 1G illustrate the structure of FIG. 1E after undergoing transformation processing to transform the portions 104 (see FIG. 1F) of semiconductor fins 110 into isolation layers 105 (see FIG. 1G). With reference to FIG. 1F, this may be accomplished (in one embodiment) by surrounding the semiconductor fins 110, with an oxidizing material 116, for example an oxide, deposited by a High Aspect Ratio Process (HARP). In one example, the HARP may include using an O₃/tetraethyl orthosilicate (TEOS) based sub-atmospheric chemical vapor deposition (SACVD) fill process to achieve a conformal deposition of silicon oxide. HARP depositions may be advantageous for gap-fill depositions of openings with high aspect ratios and may include both a slower deposition rate stage when the slower rate is advantageous for reducing defects, and a higher deposition rate stage when the high rate results in shorter deposition times. In another example, oxidizing material 116 may be a shallow-trench-isolation (STI) oxide, such as silicon dioxide, or the STI fill could also be a flowable oxide. As illustrated, oxidizing material 116 is in contact with sidewalls of portions 104 of semiconductor fins 110, while protective layer 108 protects semiconductor layers 106 of semiconductor fins 110 from contact with the oxidizing material 116. For example, protective layer 108 may be silicon nitride, or another material not containing oxygen, and serves to block any oxygen from reaching semiconductor layer 106. By way of example, FIG. 1F also depicts the deep trench region 107 in the area of the fin cut 103 (see FIG. 1E), which (in one embodiment) extends parallel to the fins and serves to isolate, in part, resultant fin devices in the different fin arrays 120, 121.

FIG. 1G illustrates the structure of FIG. 1F after processing to transform the portions (104 of FIG. 1F) of semiconductor fins 110 into isolation layers 105. In one example, the transformation process may be a selective oxidation of the portions 104 (FIG. 1F) of semiconductor fins 110. In another example, the portions of the semiconductor fins 110 may be subjected to a selective oxidation process in the presence of a HARP oxide layer 116 to form isolation layers 105 by selectively oxidizing the portions of semiconductor fins 110. The selective oxidation process may be performed, for example, by subjecting the HARP oxide to a rapid thermal oxidation (RTO) procedure or by subjecting the structure to a steam annealing procedure. In one implementation, performing selective oxidation, for example, by annealing the portions of semiconductor fins 110 in the presence of the HARP oxide contacting semiconductor fins 110, electrically isolates the semiconductor layers 106 from the substrate by converting the portions of the fins into dielectric isolation layers 105, while also providing mechanical/physical stability to the fin structure. There are many different time/temperature combinations that could be employed to achieve the oxidation discussed. In one example, the rapid thermal oxidation may be performed at about 900° C. for about 15 seconds. In another example, steam annealing may be performed in the presence of water vapor at about 500° C. for approximately 3 to 6 hours, depending upon process conditions. As a result of this processing, in one embodiment, one or more semiconductor layers 106 may have a centrally-disposed, downward-facing, V-shaped protrusion 109 at the interface between that layer and the isolation layer 105. Such an artifact may result from the oxidation of crystalline semiconductor materials in a process such as described, that is, due to material properties involved. By contrast, in another example, isolation layers 105 may be formed with flat interfaces to the semiconductor layers.

Figure 1H:
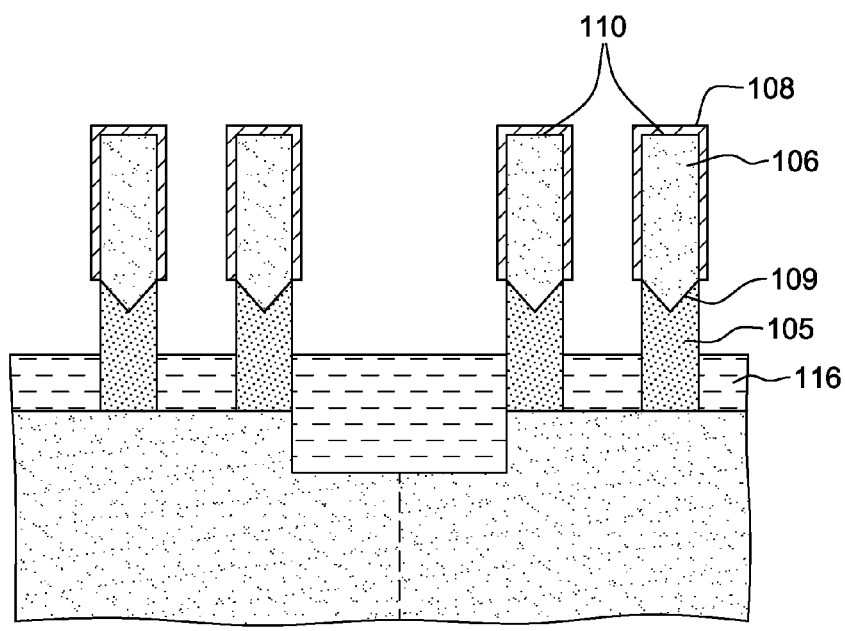
FIG. 1H depicts the structure of FIG. 1G after recessing the oxidizing material to reveal at least a portion of the semiconductor fins, in accordance with one or more aspects of the present invention.

FIG. 1H illustrates the structure of FIG. 1G after further processing to partially remove isolation material 116 and reveal (at least in part) semiconductor fins 110, including semiconductor layer 106 (protected by protective layer 108)

and isolation layer 105. Any suitable etch process, such as an isotropic dry etch process, for example, a SiCoNi etch process, may be employed to recess isolation material 116 (for instance, a HARP oxide). As one specific example, a dry etching process, such as a SiCoNi etch process, may be employed to remove a silicon oxide isolation material 116 using gas mixtures such as, for example, ammonia ($NH_3$) and nitrogen trifluoride ($NF_3$) in a plasma processing chamber. In another process variation, protective layers 108 may also be simultaneously removed, if desired.

Figure 1I:
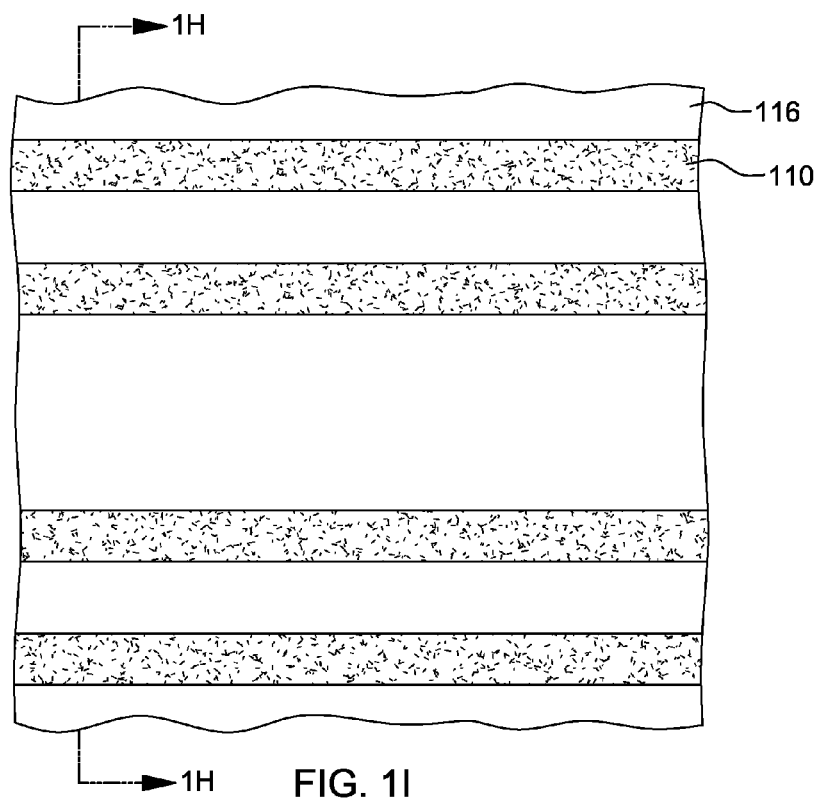
FIG. 1I depicts a plan view of the structure of FIG. 1H, illustrating the multiple parallel semiconductor fins, in accordance with one or more aspects of the present invention.

FIG. 1I illustrates in plan view the intermediate structure of FIG. 1H. As depicted, multiple parallel-extending semiconductor fins 110 are disposed over the illustrated portion of the substrate, and isolation material 116 partially fills the spaces or openings between the fins.

Figure 1J:
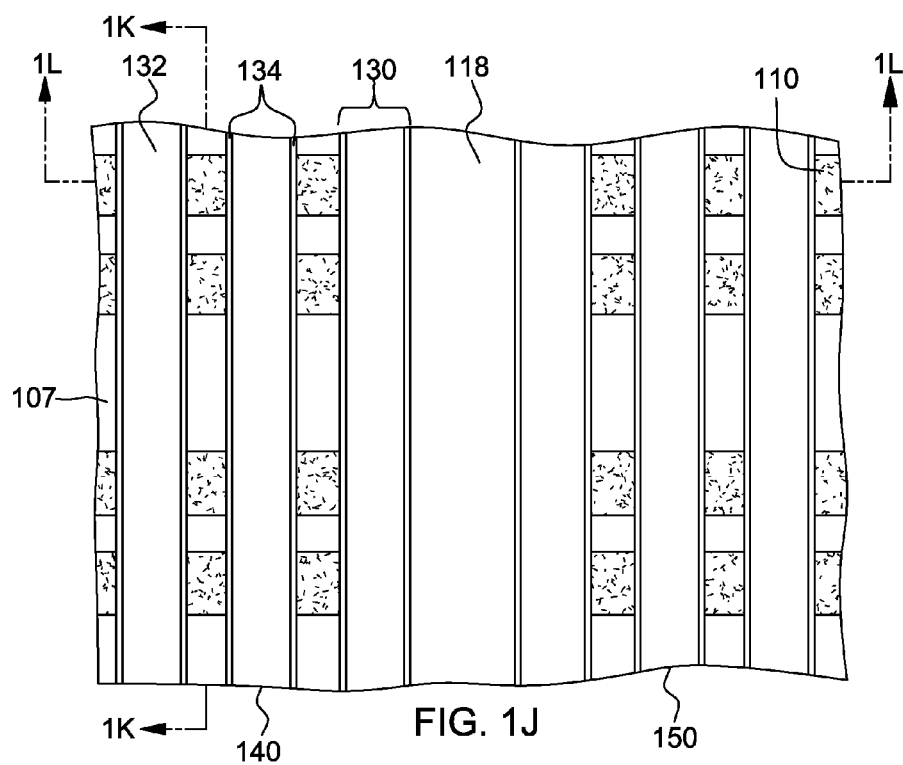
FIG. 1J depicts a plan view of the structure of FIG. 1I after multiple parallel gate structures have been disposed transversely over the fins, in accordance with one or more aspects of the present invention.

FIG. 1J illustrates the structure of FIG. 1I, after formation of gate structures 130 and processing to create PC (polycrystalline silicon or polysilicon) cut 118. The multiple semiconductor fins 110 extend parallel to one another, and are overlaid with gate structures 130 extending transverse to semiconductor fins 110. As noted, gate structures 130 may have a gate metal 132 and sidewall spacers 134, and may overlap semiconductor fins 110 in selected areas to constitute, for instance, gates of multiple FinFETs formed in associated with the fins. The length of semiconductor fins 110 may be (by way of example) a micron, several micrometers, or even the diameter of the entire wafer. PC cut 118 may separate each fin into first fin region 140 and second fin region 150. In this figure, the transverse nature of the fin cut 107 and PC cut 118 may be seen. A PC cut 118 is performed by using a selective removal process, such as previously described with regard to the creation of semiconductor fins 110, followed by deposition of a dielectric isolation barrier such as an oxide, for instance, a process as previously described with regard to deposition of the oxidizing material. It may be noted that in another example, PC cut processing may not be performed until a subsequent process step. Furthermore, gate metal 132, sidewall spacers 134, and a gate oxide (not shown) may be deposited over the course of several processing steps.

Figure 1K:
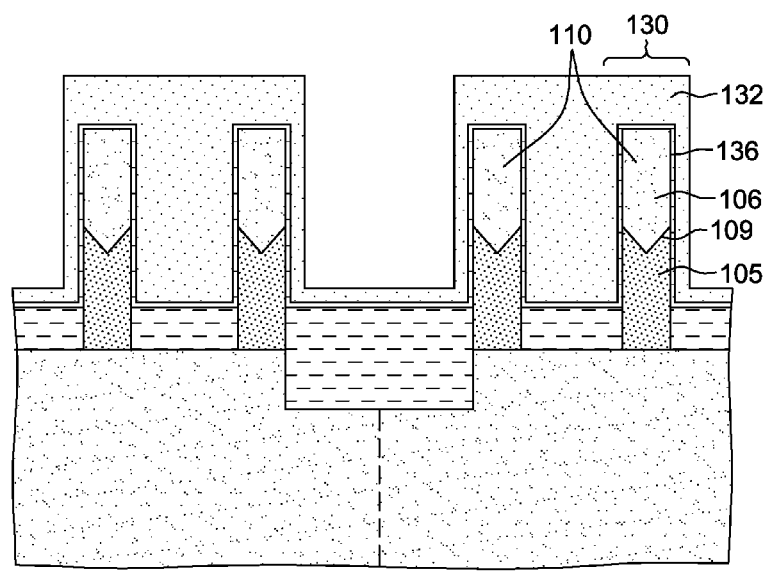
FIG. 1K depicts the structure of FIG. 1J, taken along line 1K-1K thereof, and illustrates a gate structure extending over multiple semiconductor fins, in accordance with one or more aspects of the present invention.

FIG. 1K illustrates the structure of FIG. 1J taken along line 1K-1K thereof. In this view, a single gate structure 130 having gate metal 132 and gate oxide 136 extends over multiple semiconductor fins 110. As depicted, isolation layers 105 serve to separate semiconductor layers 106 of semiconductor fins 110 from substrate 102, which prepares the structure for further processing, for instance, to create multiple fin devices utilizing different isolation schemes in different regions of the fins. In one example, semiconductor layers 106 may have centrally-disposed, downward-facing, V-shaped protrusions 109 at their interfaces with isolation layers 105. These protrusions result, in one embodiment, from processing as described herein.

Figure 1L:
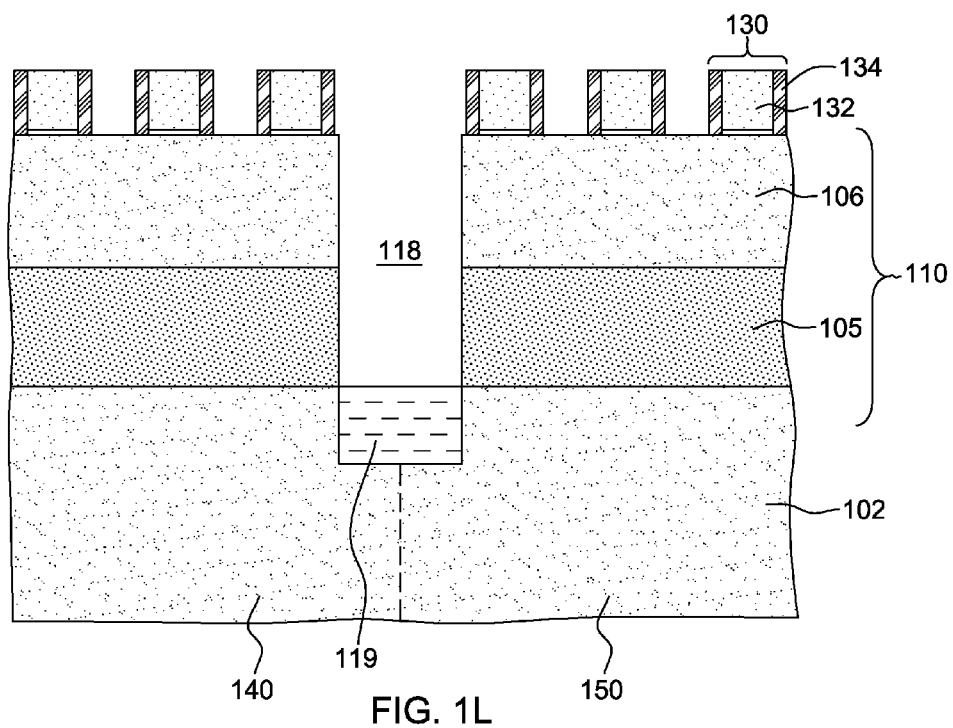
FIG. 1L depicts a cross-sectional elevational view of the structure of FIG. 1J, taken along line 1L-1L thereof, and illustrates multiple gate structures extending over a single semiconductor fin, in accordance with one or more aspects of the present invention.

FIG. 1L illustrates the structure of FIG. 1K, rotated 90° and taken along line 1L-1L in FIG. 1J. In the depicted example, recess or PC cut 118 separates the illustrated semiconductor fin 110 into a first fin region 140 and a second fin region 150 by, for example, providing a dielectric isolation barrier 119 extending vertically into the one or more semiconductor fins 110 at the PC cut 118. In another example, the dielectric isolation barrier 119 may intersect with the isolation layer 105 therein. As one example, this dielectric isolation barrier may be an oxide barrier extending vertically into or through semiconductor fin 110 to substrate 102. The presence of the dielectric isolation barrier facilitates subsequent processing to create fin devices of a first architectural type in first fin region 140, and fin devices of a second architectural type in second fin region 150, such as devices which are differently isolated or configured relative to isolation layer 105.

Figure 1M:
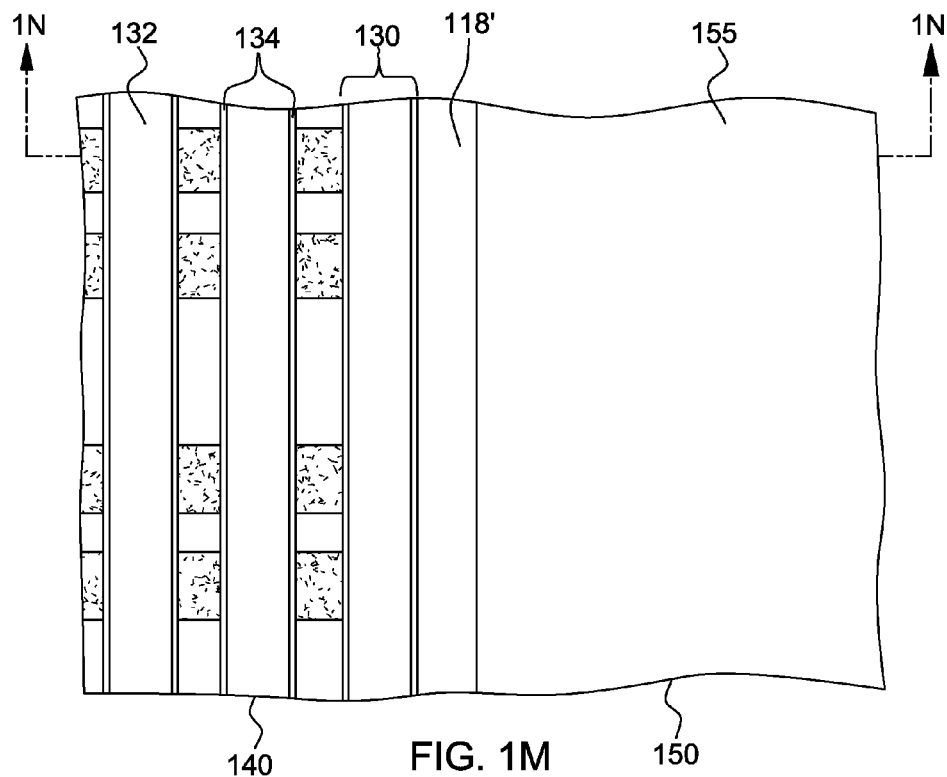
FIG. 1M depicts a plan view of the structure of FIG. 1L, wherein a first region of the structure remains exposed, and a second region has been overlaid with a protective layer, in accordance with one or more aspects of the present invention.

FIG. 1M depicts the structure of FIG. 1L after processing to overlay a protective layer 155, such as a protective mask, over second fin region 150. This protective layer 155 protects the structures of second fin region 150 from processing to be subsequently performed within first fin region 140. In one embodiment, protective layer 155 is, for instance, a hard mask layer conformally deposited over the structures, including the gate structures within second fin region 150 of the wafer and may include a nitride or an oxide, such as, for example, silicon nitride or silicon oxide, or an oxynitride or a combination thereof. The deposition processes may include any conventional process such as, for example, low temperature CVD, PECVD, or ALD. In one specific example, silicon nitride may be deposited using process gases such as, for example, dichlorosilane ($SiH_2Cl_2$) and ammonia ($NH_3$) and using known process conditions. In another example, where no high temperature processes are involved, ODL and FCVD masking may also be used. In a further example, a low-pressure CVD or ALD-created mask may be used to form the protective layer. In another example, other hard mask materials, such as metal oxides or metals, may be used. Also, note that in the depicted embodiment, protective layer 155 partially fills the PC cut, leaving a partially exposed PC cut 118'.

Figure 1N:
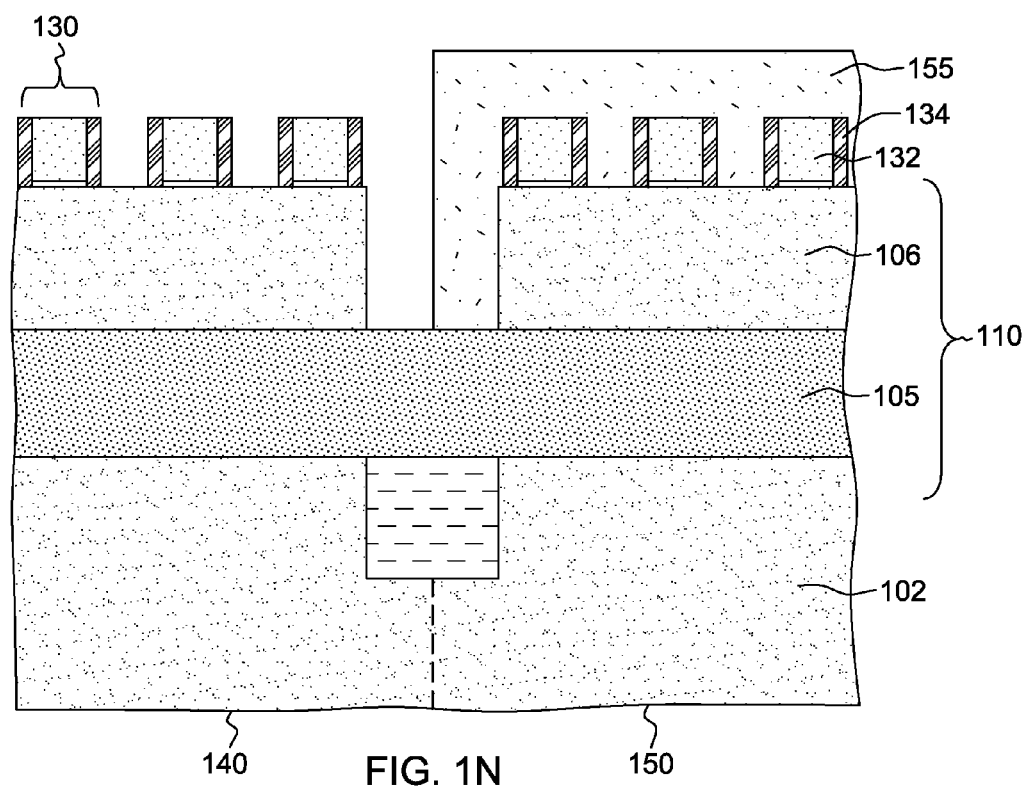
FIG. 1N depicts the structure of FIG. 1M, taken along line 1N-1N thereof, in accordance with one or more aspects of the present invention.

FIG. 1N illustrates a cross-sectional view of the structure of FIG. 1M, taken along line 1N-1N thereof, and showing that protective layer 155 overlies the structures in the second fin region 150, and protects those structures during subsequent processing in the first region 140.

Figure 1O:
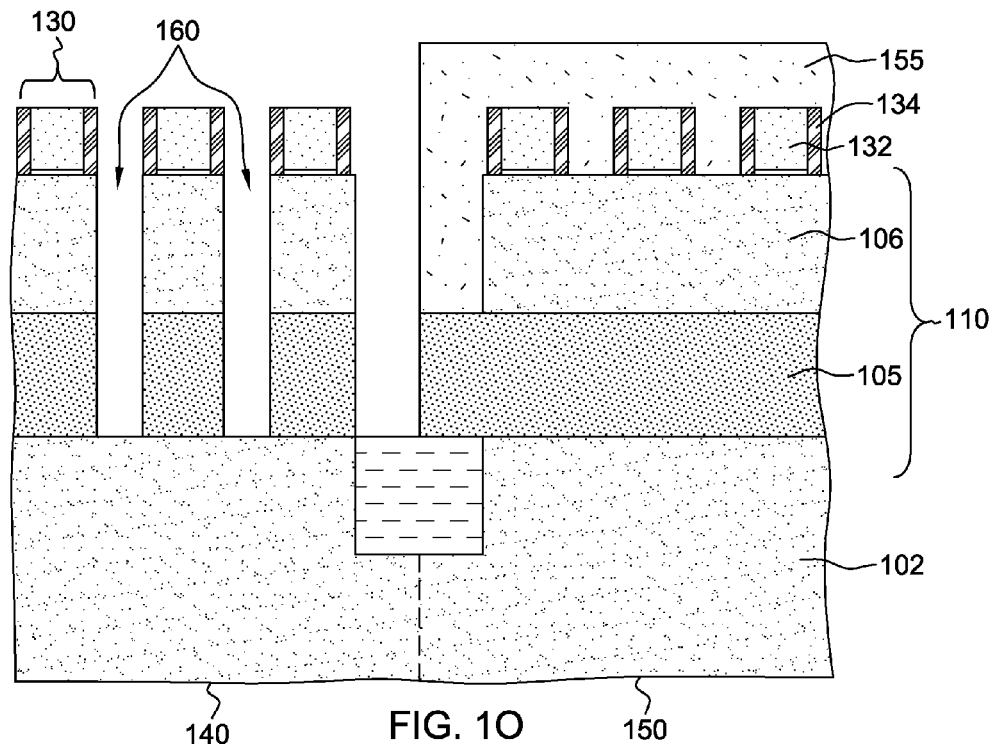
FIG. 1O depicts the structure of FIG. 1N after formation of multiple recesses in the first region thereof extending, by way of example, through the isolation layer of the depicted fin, in accordance with one or more aspects of the present invention.

FIG. 1O illustrates the structure of FIGS. 1M & 1N, after processing to form fin recesses 160 within fin(s) 110 in first fin region 140, with the second fin region 150 having been protected during the processing by the protective layer 155. In the depicted example, fin recesses 160 extend through isolation layer 105 within first fin region 140 and are disposed adjacent to gate structures 130. These fin recesses may be formed using any suitable etching process, such as isotropic dry or wet etching processing. In one example, isotropic dry etching may be performed via, for example, ion beam etching, plasma etching or isotropic RIE. In another example, isotropic wet etching may alternatively (or additionally) be performed using etching solutions such as, for example, HF:Nitric:Acetic acid solution (also known as HNA etch solution). Note that the example described herein with reference to FIGS. 1O-1T is one example only of the additional processing that may be performed within the first fin region subsequent to protection of the second fin region. Further, in terms of the recess, many variations are possible. For instance, the depth of the recess could be increased such that the fin recesses 160 extend into substrate 102 or, for instance, different fin recesses may extend to different depths into the respective fin. Note also that formation of fin recesses may occur across multiple fins exposed on the wafer, that is, the first fin region may comprise multiple regions of, for example, a plurality of parallel-extending fins on the wafer.

Figure 1P:
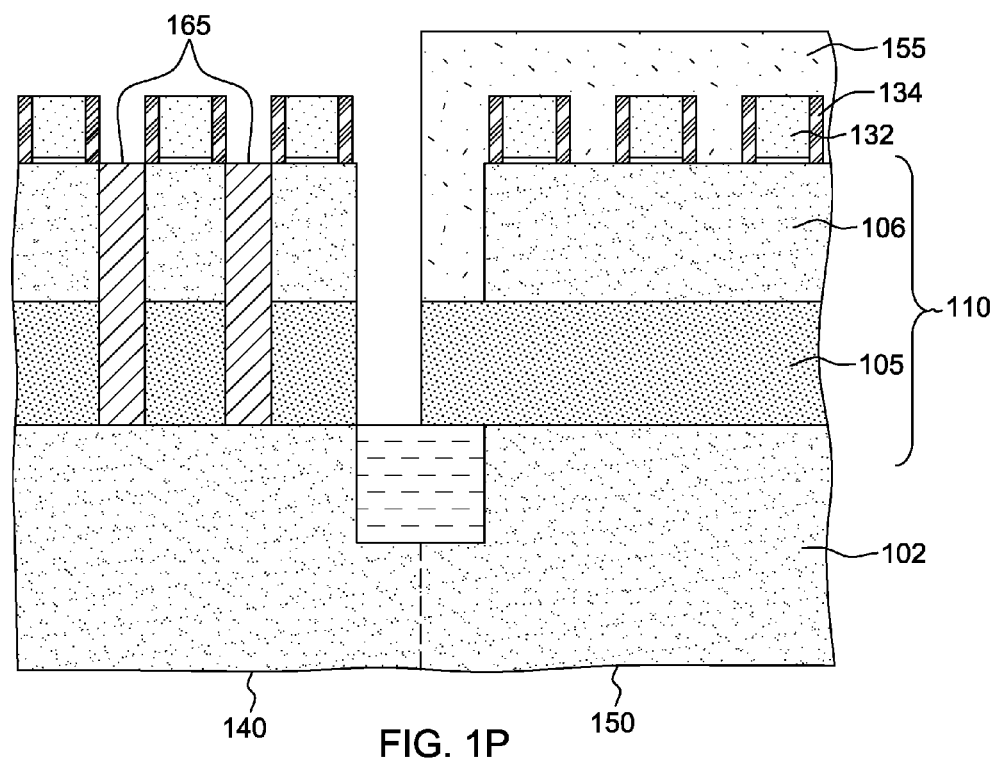
FIG. 1P depicts the structure of FIG. 1O after filling the fin recesses in the first region thereof with a material, in accordance with one or more aspects of the present invention.

FIG. 1P illustrates the structure of FIG. 1O after filling of fin recesses 160 in first fin region 140 with a material 165, such that, in the illustrated example, material 165 extends through isolation layer 105 in the exposed first fin region 140. In one example, the structure of FIG. 1P may be obtained by epitaxially growing a semiconductor material, at least partially, from the lower region of semiconductor fin 110 or substrate 102, upwards through the fin recesses 160

(see FIG. 1O). Material 165 may constitute a source or drain, which facilitates forming first architectural type fin devices in first fin region 140 that have embedded stress elements penetrating isolation layer 105.

In one example, the embedded stress elements (that is, material 165) are formed of a semiconductor material, such as silicon germanium or silicon carbon. Silicon germanium could be grown in order to fabricate a p-type MOS (PMOS) structure, while silicon carbon or, for example, silicon doped with phosphorus (SiP), where the atomic percentage of phosphorus may vary, for instance, between about 0.1 percent to about 10 percent, could be grown in order to fabricate an n-type MOS (NMOS) structure. In another example, there could be multiple steps of epitaxial growth (with the use of appropriate protective layers), first growing silicon germanium, followed by growing silicon carbon, with the result being one each of a PMOS and NMOS transistor, yielding a CMOS circuit. Epitaxially growing the semiconductor material would, in one embodiment, take place starting with the substrate, because the semiconductor substrate is (in one example) a crystalline material from which epitaxial growth is possible, but in another example epitaxial growth could take place from, for instance, a portion of the side walls of semiconductor fins 110, such as the sidewalls of semiconductor layers 106. Stress-inducing materials, such as one or more tensile stress inducing materials to improve the tensile stress of an NMOS transistor or one or more compressive stress inducing materials to improve the compressive stress of a PMOS transistor, may also be epitaxially grown. In one example, the tensile stress of an NMOS transistor may be improved using tensile stress inducing materials, such as silicon doped with carbon and phosphorous Si:C(P), where the atomic percentage of carbon may be about 1 percent to about 3 percent. The term "tensile stress inducing material" denotes a material layer having an intrinsic tensile stress, in which the intrinsic tensile stress produces a tensile stress in one or more adjacent materials. For instance, a tensile stress-inducing material may be a material having an intrinsic compressive stress, in which the intrinsic compressive stress produces a tensile stress in one or more adjacent materials, or a material with a larger lattice constant and volume than the adjacent material that is lattice-matched to the stress-inducing material. The tensile stress inducing materials are epitaxially grown using selective epitaxial growth via various methods, such as, for example, CVD, RPCVD, LPCVD, or other applicable methods. The selective epitaxial growth starts when at least one semiconductor source gas is injected into the reaction chamber. In one example, silicon doped with phosphorus may be formed using gases such as, for example, dichlorosilane ($SiH_2Cl_2$) gas or silane ($SiH_4$) with phosphine ($PH_3$). In another example, the semiconductor source gas may be a silicon source gas, such as, for example, silane ($SiH_4$) gas, a disilane ($Si_2H_6$) gas, a dichlorosilane ($SiH_2Cl_2$) gas, a $SiHCl_3$ gas, or a $SiCl_4$ gas, or may include a carbon source gas for the growth of SiC.

In another example of processing for creating embedded stress elements, the compressive stress of a PMOS transistor may be improved using compressive stress inducing materials for the source and drain, such as, for example, silicon germanium (SiGe) where the atomic percentage of germanium may vary, for instance, between about 0.1 percent to about 10 percent, and may be epitaxially grown above the silicon (Si) fins. The term "compressive stress inducing material" denotes a material having an intrinsic compressive stress, in which the intrinsic compressive stress produces compressive stress in one or more adjacent materials. For instance, a compressive stress-inducing material may be a material having an intrinsic tensile stress, in which the intrinsic tensile stress produces a compressive stress in one or more adjacent materials, or a material with a smaller lattice constant and larger volume than the adjacent material that is lattice-matched to the stress-inducing material. The epitaxial growth may be realized using selective epitaxial growth via various methods, such as, for example, CVD, RPCVD or other applicable methods and may be initiated using a silicon germanium source gas, which may include a stoichiometric ratio of silicon source gas and the germanium source gas. The stoichiometric ratio depends on the percentage of SiGe that is being grown. In addition, the SiGe may be doped as well. The semiconductor source gas may instead be, for example, one of the more advanced gases from the family of germyl-silanes, such as $H_3GeSiH_3$, $(H_3Ge)_2SiH_2$, $(H_3Ge)_3SiH$, or $(H_3Ge)_4Si$. Note that, in another embodiment, material 165 could comprise epitaxially-grown semiconductor material which wraps around, for instance, more than one fin so as to create a multi-channel device. In another example, additional or different devices (such as passive devices) could be provided within the first fin region, depending upon the particular desired circuit design. Also, deposition of the source or drain contact material could take place after removal of the protective layer 155.

Figure 1Q:
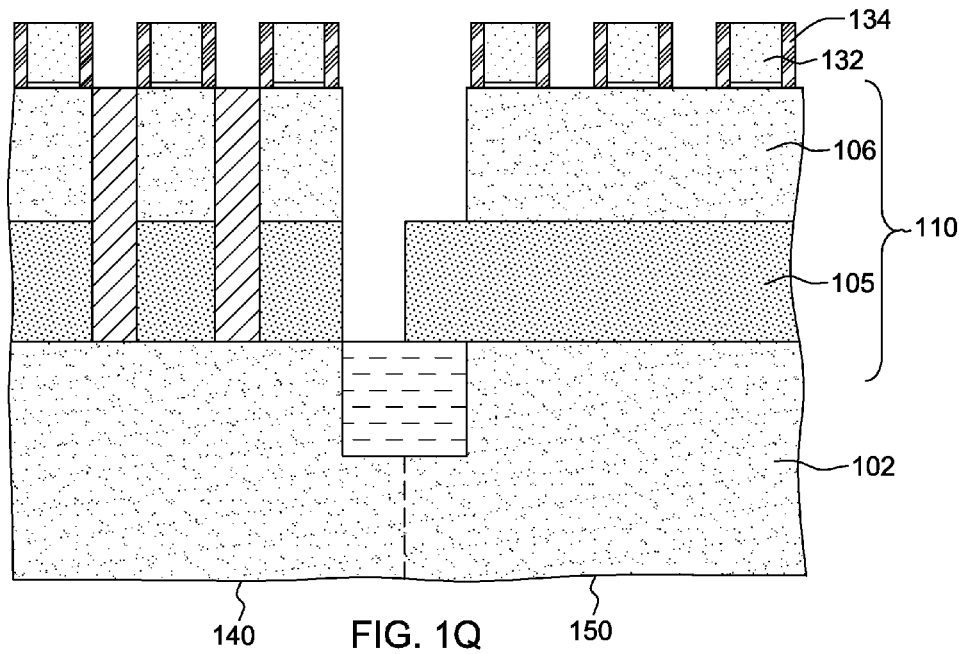
FIG. 1Q depicts the structure of FIG. 1P after removal of the protective layer from over the second region thereof, in accordance with one or more aspects of the present invention.
Figure 1R:
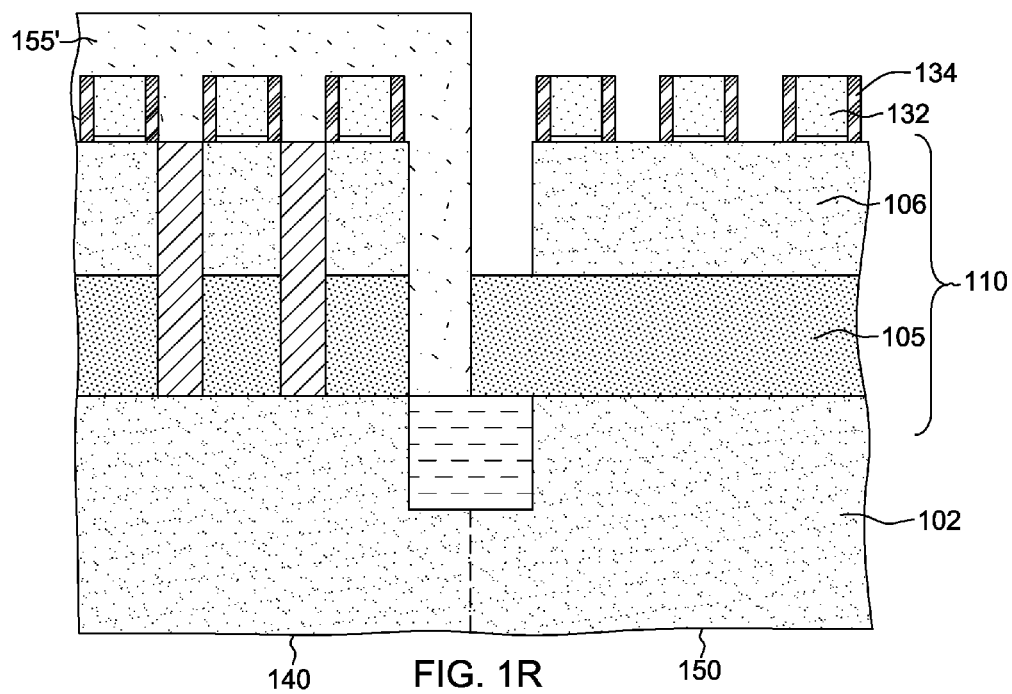
FIG. 1R depicts the structure of FIG. 1Q after providing a protective layer over the first region of the structure, in accordance with one or more aspects of the present invention.
Figure 1S:
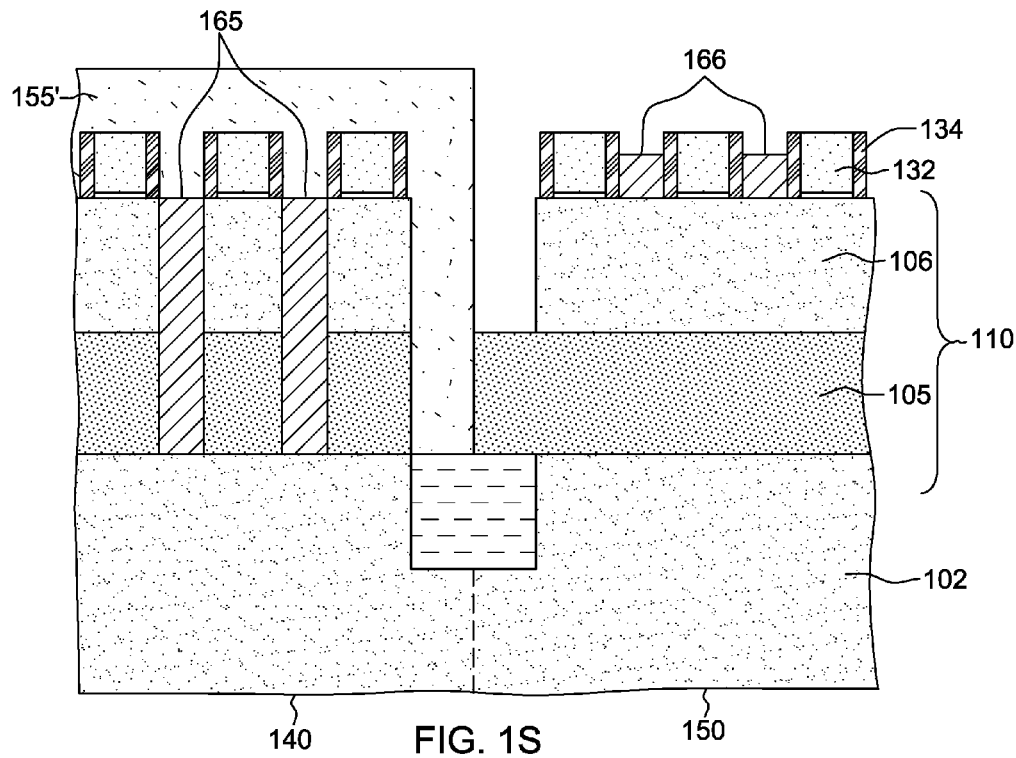
FIG. 1S depicts the structure of FIG. 1R after processing to fill the spaces between gate structures in the second region with a material, in accordance with one or more aspects of the present invention.
Figure 1T:
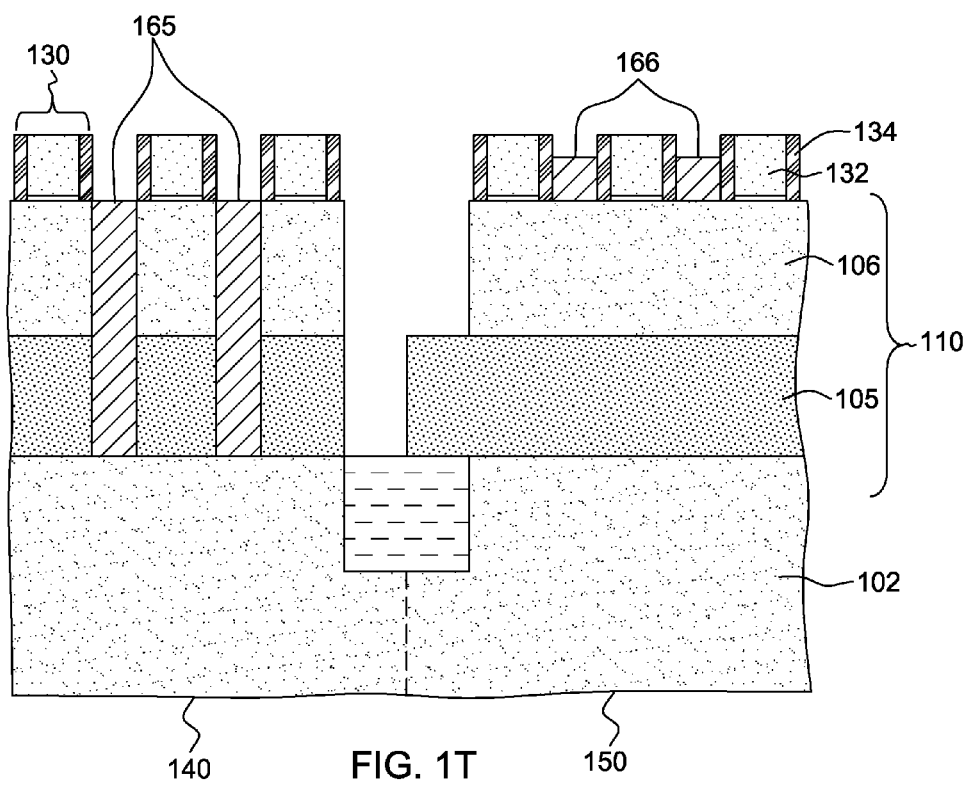
FIG. 1T depicts the structure of FIG. 1S after removing the protective layer from over the second region thereof, in accordance with one or more aspects of the present invention.

FIG. 1Q depicts the intermediate structure of FIG. 1P after removal of the protective layer from second fin region 150, which exposes second fin region 150 for further processing (one example of which is depicted in FIGS. 1R-1T). The protective layer may be removed by any suitable etching process, such as anisotropic dry etching processing, for instance, RIE.

FIG. 1R illustrates the structure of FIG. 1Q with a further protective layer 155' having been provided over first fin region 140 to, for instance, facilitate processing second fin region 150 of the semiconductor fins 110. Additional protective layer 155' may be provided using any of the techniques described above with regard to the protective layer 155 (FIG. 1M) provided over second fin region 150. Note that, in another example, and depending on the process steps involved, second fin region 150 may be processed simultaneously with first fin region 140, obviating the need for a second processing step using additional protective layer 155'.

FIG. 1S illustrates the structure of FIG. 1R after provision of a material 166 between gate structures 130 in the second fin region 150. This material 166, which may partially overly fin(s) 110 or may wrap around the semiconductor layer 106 of semiconductor fin 110, may be formed as a source or drain of a FinFET, resulting in or facilitating forming a second architectural type fin device(s) with second fin region 150, which lack embedded stress elements, and which may be, for instance, isolated-type fin transistors (that is, be disposed entirely above the isolation layer 105). In one example, some or all of material 165 or 166, which are source or drain elements, may be doped to form either n-type or p-type material, depending on design requirements. The doping may be done in situ, during the time of epitaxial growth or ex situ, after the epitaxial growth is completed. Ex situ doping may be performed by blanket implants, masked implants, or plasma doping.

FIG. 1T illustrates the structure of FIG. 1S after removal of protective layer 155', using any of the techniques described above with regard to removal of the protective layer provided over second fin region 150. From this structure, first architectural type fin devices may be completed in first fin region 140, having, for example, embedded stress elements 165, and second architectural type fin devices may be completed in second fin region 150, being (for instance) isolated-type fin transistors. In one embodiment, both architectural type fin devices may be fin-type transistors, but differently configured. Note that by using fins fabricated as disclosed herein, the different architecture type devices may incorporate or use different isolation schemes, such as junction-isolated, partially isolated, or fully isolated.

Figure 2A:
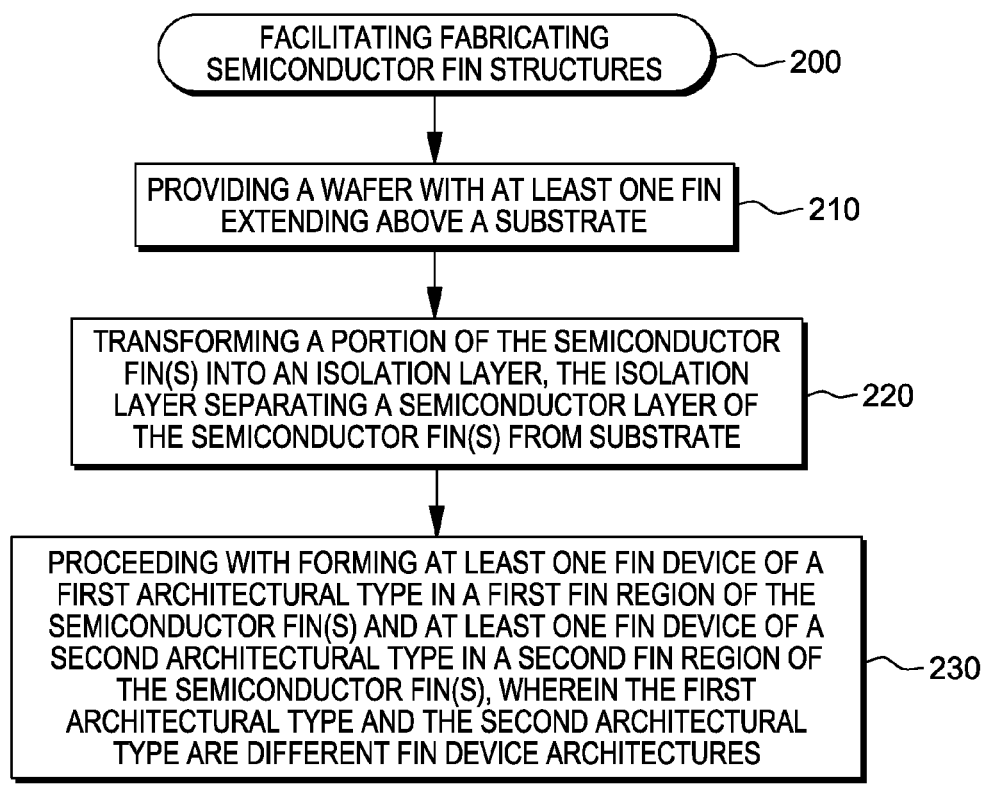
FIGS. 2A & 2B depict one embodiment of a process for facilitating fabricating semiconductor fin structures, in accordance with one or more aspects of the present invention.
Figure 2B:
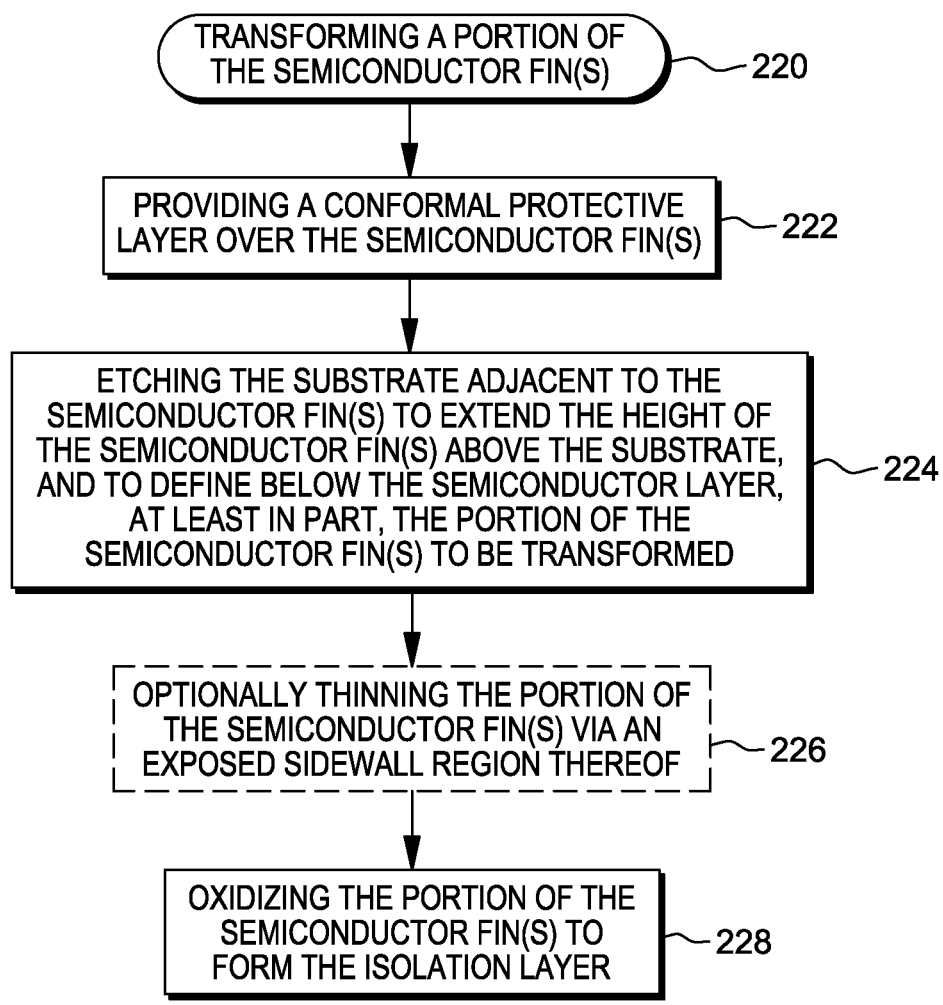

By way of summary, FIGS. 2A & 2B illustrate an overview of one embodiment of a process for facilitating fabricating semiconductor fin structures 200, in accordance with one or more aspects of the present invention. In the embodiment illustrated, the method includes, for example: providing a wafer with at least one fin extending above a substrate 210; transforming a portion of the at least one semiconductor fin into an isolation layer, the isolation layer separating a semiconductor layer of the at least one semiconductor fin from the substrate 220; and proceeding with forming at least one fin device of a first architectural type in a first fin region of the at least one semiconductor fin and at least one fin device of a second architectural type in a second fin region of the at least one semiconductor fin, wherein the first architectural type and the second architectural type are different fin device architectures 230.

FIG. 2B depicts one embodiment of a process for transforming a portion of the semiconductor fin(s) 220, in accordance with one or more aspects of the present invention. As illustrated, the transforming may include, for instance: providing a conformal protective layer over the semiconductor fin(s) 222; etching the substrate adjacent to the semiconductor fin(s) to extend the height of the semiconductor fin(s) above the substrate, and to define below the semiconductor layer, at least in part, the portion of the semiconductor fin(s) to be transformed 224; optionally thinning the portion of the semiconductor fin(s) via an exposed sidewall region thereof 226; and oxidizing the portion of the semiconductor fin(s) to form the isolation layer 228.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include" (and any form of include, such as "includes" and "including"), and "contain" (and any form contain, such as "contains" and "containing") are open-ended linking verbs. As a result, a method or device that "comprises", "has", "includes" or "contains" one or more steps or elements possesses those one or more steps or elements, but is not limited to possessing only those one or more steps or elements. Likewise, a step of a method or an element of a device that "comprises", "has", "includes" or "contains" one or more features possesses those one or more features, but is not limited to possessing only those one or more features. Furthermore, a device or structure that is configured in a certain way is configured in at least that way, but may also be configured in ways that are not listed.

The corresponding structures, materials, acts, and equivalents of all means or step plus function elements in the claims below, if any, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of one or more aspects of the invention and the practical application, and to enable others of ordinary skill in the art to understand one or more aspects of the invention for various embodiments with various modifications as are suited to the particular use contemplated.

What is claimed is:

1. A semiconductor structure comprising:
    a wafer with at least one semiconductor fin extending above a substrate;
    a semiconductor layer and an isolation layer disposed within the at least one semiconductor fin, the isolation layer isolating the semiconductor layer of the at least one semiconductor fin from the substrate, wherein the semiconductor layer comprises a protrusion extending into the isolation layer;
    at least one fin device of a first architectural type in a first fin region of the at least one semiconductor fin and at least one fin device of a second architectural type in a second fin region of the at least one semiconductor fin, wherein the first architectural type and the second architectural type comprise different fin device architectures; and
    at least one fin recess in the at least one semiconductor fin extending through the isolation layer to the substrate beneath the at least one semiconductor fin.

2. The semiconductor structure of claim 1, wherein the isolation layer is disposed between the semiconductor layer and the substrate.

3. The semiconductor structure of claim 1, wherein an upper portion of the at least one semiconductor fin comprises the semiconductor layer and a lower portion of the at least one semiconductor fin comprises the isolation layer.

4. The semiconductor structure of claim 1, wherein the semiconductor layer comprises a centrally disposed protrusion extending into the isolation layer.

5. The semiconductor structure of claim 1, wherein the protrusion is V-shaped.

6. The semiconductor structure of claim 1, wherein each of the first fin region and the second fin region include a respective portion of the semiconductor layer and the isolation layer of the at least one semiconductor fin.

7. The semiconductor structure of claim 1, further comprising a conformal protective layer over the semiconductor layer of the at least one semiconductor fin.

8. The semiconductor structure of claim 7, wherein the at least one semiconductor fin includes an exposed sidewall region below the conformal protective layer.

9. The semiconductor structure of claim 8, wherein the isolation layer comprises the exposed sidewall region below the conformal protective layer.

10. The semiconductor structure of claim 7, wherein the conformal protective layer comprises a hard mask layer.

11. The semiconductor structure of claim 1, further comprising an oxidizing material surrounding the at least one semiconductor fin above the substrate.

12. The semiconductor structure of claim 11, wherein the isolation layer is an oxidized portion of the at least one semiconductor fin.

13. The semiconductor structure of claim 11, further comprising a conformal protective layer between the semiconductor layer of the at least one semiconductor fin and the oxidizing material.

14. The semiconductor structure of claim 1, wherein the at least one fin device of a first architectural type comprises at least one embedded stress element.

15. The semiconductor structure of claim 14, wherein the at least one embedded stress element extends through the isolation layer into the substrate.

16. The semiconductor structure of claim 1, wherein the at least one fin device of a second architectural type comprises at least one isolated-type fin transistor.

17. The semiconductor structure of claim 16, wherein the at least one isolated-type fin transistor is disposed above the isolation layer of the at least one semiconductor fin.

18. The semiconductor structure of claim 1, wherein the substrate comprises a semiconductor substrate, and wherein the semiconductor structure further comprises a semiconductor material extending from the semiconductor substrate through the at least one fin recess in the at least one semiconductor fin.

19. The semiconductor structure of claim 18, wherein the semiconductor material comprises one of n-type or p-type material.

* * * * *